United States Patent [19]

Mochizuki et al.

[11] Patent Number: 5,680,039
[45] Date of Patent: Oct. 21, 1997

[54] PROBE APPARATUS FOR USE IN BOTH HIGH AND LOW FREQUENCY MEASUREMENTS

[75] Inventors: Kohei Mochizuki; Satoshi Habu, both of Tokyo, Japan

[73] Assignee: Hewlett-Packard Company, Palo Alto, Calif.

[21] Appl. No.: 382,501

[22] Filed: Feb. 2, 1995

[30] Foreign Application Priority Data

Feb. 4, 1994 [JP] Japan ................ 6-032875

[51] Int. Cl.⁶ ........................................... G01R 31/02
[52] U.S. Cl. .................. 324/72.5; 324/128; 324/520; 333/81 A
[58] Field of Search ........................ 324/128, 132, 324/72.5, 520, 658; 333/81 A

[56] References Cited

U.S. PATENT DOCUMENTS

| | | | |
|---|---|---|---|
| 2,131,101 | 9/1938 | Ferris | 324/128 |
| 3,532,982 | 10/1970 | Zeidlhack et al. | 324/72.5 |
| 3,701,037 | 10/1972 | Hoer | 330/10 |
| 3,875,537 | 4/1975 | Dolby | 323/28 R |
| 4,051,432 | 9/1977 | Sarjeant | 324/72.5 |
| 4,418,314 | 11/1983 | Nieto, Jr. | 324/72.5 |
| 4,473,857 | 9/1984 | Winter | 324/72.5 |
| 4,507,618 | 3/1985 | Nelson | 330/126 |
| 5,107,201 | 4/1992 | Ogle | 324/72.5 |
| 5,172,051 | 12/1992 | Zamborelli | 324/72.5 |

Primary Examiner—Maura K. Regan

[57] ABSTRACT

This invention is an inexpensive probe apparatus operating at high precision that can be used for both low-frequency and high-frequency measurements. A line with a first and second conductor is extended from a probe connected to a circuit component. A low-frequency or high-frequency device is alternately connected to the line. A third common conductor runs parallel to the aforementioned line and a resistor and capacitor is connected between the probe end of the aforementioned second conductor and the aforementioned common conductor.

4 Claims, 7 Drawing Sheets

PROBE APPARATUS FOR USE IN BOTH HIGH AND LOW FREQUENCY MEASUREMENTS

1. Field of the Invention

This invention pertains to a probe apparatus for measuring circuit components and to a measuring device for circuit components that uses said probe apparatus. It pertains particularly to a probe apparatus that is used both in high-frequency and low-frequency measuring devices. In this specification, measuring devices include so called supply instruments such as pulse generators.

2. Background of the Art

Measurements of electrical circuit components (referred to simply as components below), such as I.C.s, must be performed at high speed and with high precision as well as with high reliability. Due to the progress that has been made with respect to extensive integration and the increasingly high performance of components, there is a tendency for signals handled by one component to be mixed digital and analog signals. Moreover, it has become a problem to assuredly conduct a test to prove high-frequency and high-speed operation, and a test and analysis of components quality in low-frequency, high-precision measurements.

An integrated circuit (IC) will be described below as an example of a component. However, this invention can also be used for components of a more complex structure (VLSI, etc.) and for components of a simpler structure (two-terminal resistors, etc.), and therefore, the following description encompasses such components.

In general, the measurement of components involves a structure whereby a tool (or a fixture) for mounting the components is installed and this tool is connected to the measuring device by a measurement line, in order to electrically connect the measuring device and the components. Input-output terminal spacing is as small as a fraction of mm and there are as many as several hundreds of input and output terminals present in modern high-density, high-performance components. Furthermore, since a size of components remains substantially the same, manipulations near the input and output terminals have become increasingly difficult.

A tool used for terminal mounting first extends the input and output terminals of the component in an outward radiating pattern so as to increase the spacing between the lines. In order to do this, a probe card is provided as a tool for an integrated circuit measurement and is disposed nearest to the components. The probe card will be explained in detail in the examples of this invention. In general, many probes lines for contacting component input and output terminals are placed on an annular substrate.

It has also become necessary for the measuring device to accomplish a variety of functions, due to the development of high performance components. Cases where several types of measuring devices must be alternately connected to a same input terminal are frequently encountered. There are many cases where switching of the measuring devices should preferably occur in a close proximity of the components. This task is made difficult for the aforementioned reasons. Once the distance between input/output conductors has been increased by the probe card, switching can be performed with switching matrix means, etc. In the present specification, the term probe apparatus is used to describe the apparatus extending from the probe card to a switching matrix means interface.

Measuring devices that operate with high-performance components easily become expensive and large in size, so there are limits to the number of devices that can be used. Since there is also a requirement that a single measuring device be used for measurements at many input and output terminals, switching matrix means are employed to satisfy these requirements.

FIG. 1 is a diagram showing a prior art structure of a measuring system for a flash memory cell F. A gate probe G is coupled to control gate CG and there is control gate CG. A substrate probe SUB is connected to a P-type substrate. A drain probe D is connected to an N-type drain region, and a source probe S is connected to an N-type source region.

A pulse generator PG (referred to as PG below) has output terminals that generate high-speed ternary pulses. Moreover, a current setting, voltage measurement/voltage setting, current measurement unit SMU (referred to below as SMU) alternately selects between the current setting/voltage measurement, or the voltage setting/current measurement. The SMU unit is the same as described in Japanese Laid-open Patent application No. Sho 58(1983)148507, which was developed by the applicant of the present invention. As this is a well-known device, its description will be omitted.

In FIG. 1, the PG or SMU are selectively connected to the probes connected to flash memory cell F, by lines connected to each device. The selection means is a switching matrix means SWM (referred to below as SWM) which operates so that either the PG or the SMU is connected to cell F. To write the aforementioned cell, the SMU is connected to the source probe S and brought to ground potential and the PG is connected to the gate probe G and drain probe D. All probes G, S, D, and SUB are connected to the SMU, so that measurements of leakage current and direct-current voltage and current characteristics can be performed.

FIG. 2 shows an SMU and the aforementioned PG. Lines 32, 34, 36, 38, etc., on probe guard 40 are each connected to some of the many probes that contact the circuit component to be tested (DUT) 50 and to buses 16 and 18 in SWM 14 by switches 22, 28, etc. PG 2, SMU 6, and PG 4 are connected to buses 16 and 18 via switches 20, 24, and 26, respectively.

The connections between PG 2, SMU 6, PG 4 and switches 20, 24, and 26, respectively, are accomplished by lines 8, 12, and 10. Lines 8 and 10 are coaxial cables, micro-strip lines or twisted pair lines, etc., and line 12 is a quadriaxial line or a modified quadriaxial line in which 2 conductors of the innermost layers have been made into 2 parallel lines or twisted pairs. When the conductors of lines 12 are referred to as the first, second, third and fourth conductors (from the inside out), the first conductor is used for sensing voltage, the second conductor is used for current supply, and the third conductor is a guard conductor, so that during operation its potential is kept at essentially the same potential as that of the first conductor. The function of a guard conductor is to isolate an adjacent conductor from stray voltages by maintaining a potential that is substantially the same as that which appears on the adjacent conductor. The fourth conductor is usually grounded and blocks electromagnetic interference from the outside. The first and second conductors of line 12 serve as signal lines, while the third conductor is usually used as a guard line.

In order to clarify problems relating to the circuit of FIG. 2, referring to the equivalent circuit in FIG. 3, (which assumes that measurements are performed with lines 8, 32, and 34 as shown in FIG. 2). Common conductor 42 is connected to a chassis, etc. PG 2 and line 8 in FIG. 2 are represented by pulse source 102 and output resistor 103. The lines for switches 20 and 22 and line 32 are represented as line 108, comprising first conductor 1081 and second conductor 1082. Line 34 and switches 24 and 28 of FIG. 2 are represented as line 112, comprising first conductor 1121 and second conductor 1122. Line 12 and SMU 6 are represented as load 106. Load 106 is represented as resistors R1, R2 and R3 in the form of a Y connection. The outer terminals of the Y connection are connected to second conductor 1122, first conductor 1121, and common conductor 42, respectively. The characteristic impedance Zc of line 108 is usually the same as resistor 103, and also the characteristic impedance of line 112 is Zc.

When pulses are applied from pulse source 102, since an abrupt change in line impedance occurs then the pulses are reflected in the measurement, because grounded ends A and B near DUT 50 of second conductors 1082 and 1122 are open. As a result, there is distortion of the pulse wave shape applied to DUT 50 and an increase in measurement error.

In order to solve this problem, the following methods may be used:

Method 1: switches that close ends A and B are installed and the abrupt change in line impedance is prevented by closing these switches during pulse application. When the SMU is connected during direct-current measurements, the switches are opened and second conductors 1082 and 1122 operate as guards.

Method 2: switches are installed between aforementioned ends A and B and the common conductor, and these switches are closed during pulse application.

Method 3: switches are used with capacitance components (capacitors) according to method (2). When there are few terminals in DUT 50, aforementioned methods (1) and (2) are used. The inventors of the present invention use method (3).

By means of method (1), many switches are necessary. For example, 48×(48−1)/2=1,128 switches are needed for 48 probes in an ordinary probe apparatus (when each probe is not separate or when there are many probes that are not separate) and execution of this method is physically impossible.

With method (2), there are as many switches as there are probes, but this method is complex as well as large and expensive, because there is also a drive circuit involved. Moreover, although a highly reliable device might be realized with ultra small switches and such a device might be integrated into a measurement circuit, at the present time this type of technology can not be found.

Therefore, the inventors have performed studies of method (3) and discovered that since driving is not necessary, a physically smaller device can be used, and its packaging is simple. However, when compared to aforementioned methods (1) and (2), the following problems are encountered:

(X.1) Ringing is produced on the pulse wave shape due to capacitance.

(X.2) Instability of SMUG operation occurs when the capacitance is high.

Consequently, the objective of this invention is to solve the aforementioned problems with a probe apparatus that can be used for both high-frequency measurements, such as pulse drive measurements, etc., as well as low-frequency (including direct-current) measurements, such as measurements using an SMUG, etc.

SUMMARY OF THE INVENTION

Direct-current insulation of the aforementioned second conductors 1082 and 1122 and common conductor 42 is maintained while assuring alternating-current return path by inserting a resistor and capacitor series circuit between the second conductors of the lines near the probes and common conductor 42. This feature will now be generally described.

A probe apparatus is presented where, in a transmission circuit with a line having a first and second conductors and a common conductor, the second conductor and common conductor are connected by a resistor and capacitor series connection at one end of the line. There is a switch means for the aforementioned first and second conductors at the other end of the line. Furthermore, in this probe apparatus the switch alternates between a first and second state. The first and second conductors are connected to the core conductor and ground, respectively, of a high-frequency line when the switch means is in the first state, while the first and second conductors are connected to the signal line and guard line, respectively, of a low-frequency line when the switch means is in the second state. The grounds are short-circuited by the common conductor.

Moreover, a circuit-component measuring device can be made, as previously mentioned, by using the aforementioned probe apparatus; a high-frequency measuring device is connected to the high-frequency line, and a low-frequency measuring device (e.g. an SMUG), is connected to the low-frequency line. It is preferred that the capacity of the aforementioned capacitor have a value corresponding to the capacity-to-ground allowed by the guard line of the low-frequency measuring device and that this value be as high as possible. Moreover, the resistance of the aforementioned resistor can be set at the value of the specific resistance of the loop that comprises the second conductor, the resistor and capacitor connected in series, and the common conductor.

The probe apparatus of this invention is made by placing an annular conductor on an insulating substrate and then placing several lines, each comprising first and second conductors in a radiating pattern from the center of the aforementioned annular conductor, connecting certain of the aforementioned second conductors with the aforementioned annular conductor by the resistor and capacitor connected in series at the end of the aforementioned line near the center part, and attaching circuit-component measuring probes at certain of the first conductors.

Furthermore, a value of the above mentioned resistor may be a value of the characteristic impedance.

Definition of Symbols
PG, PG 2, PG 1: pulse generators
SMUG: device for current setting/voltage measurement and voltage setting/current measurement
SWM: switching matrix means
CG: control gate
FG: floating gate
G: gate probe
S: source probe
SUB: substrate probe
DUT: circuit component to be determined
2, 4: pulse generator
6: SMUG
14: SWM
40: probe apparatus guard means
50: DUT
42: common conductor

DETAILED DESCRIPTION OF THE INVENTION

Figure 3:
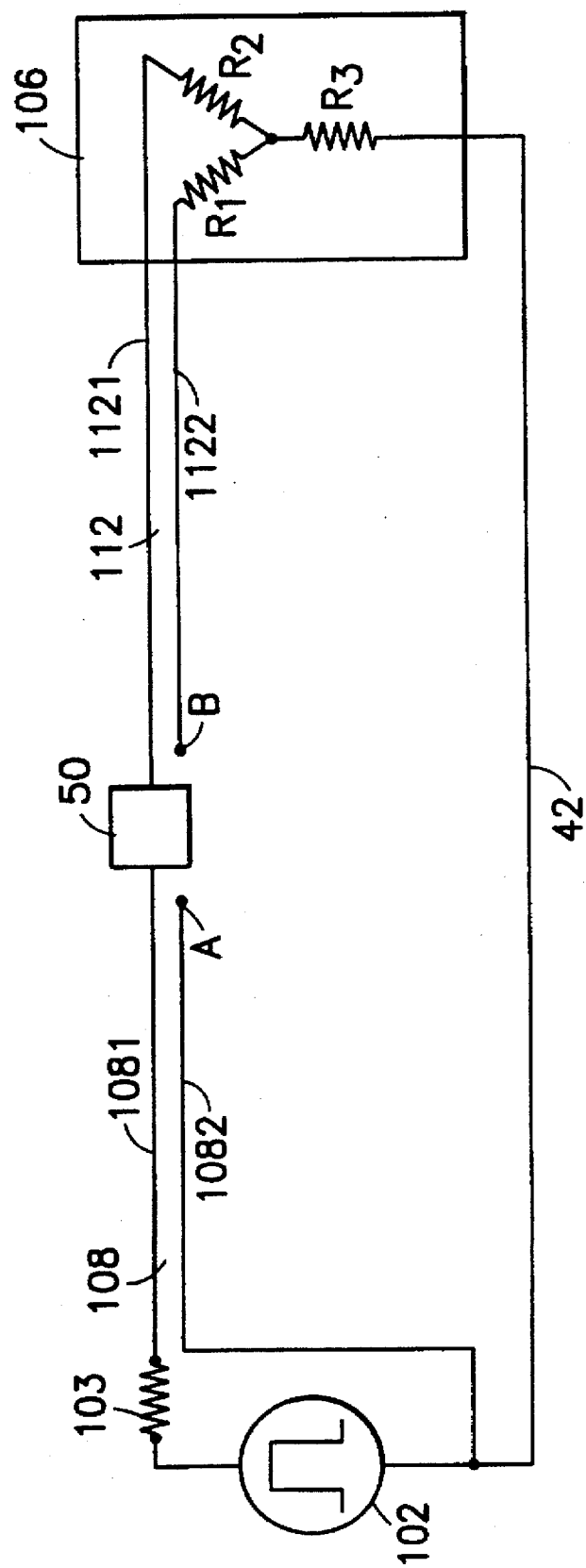
FIG. 3 is a partial equivalent circuit diagram of the circuit in FIG. 2.
Figure 4A:
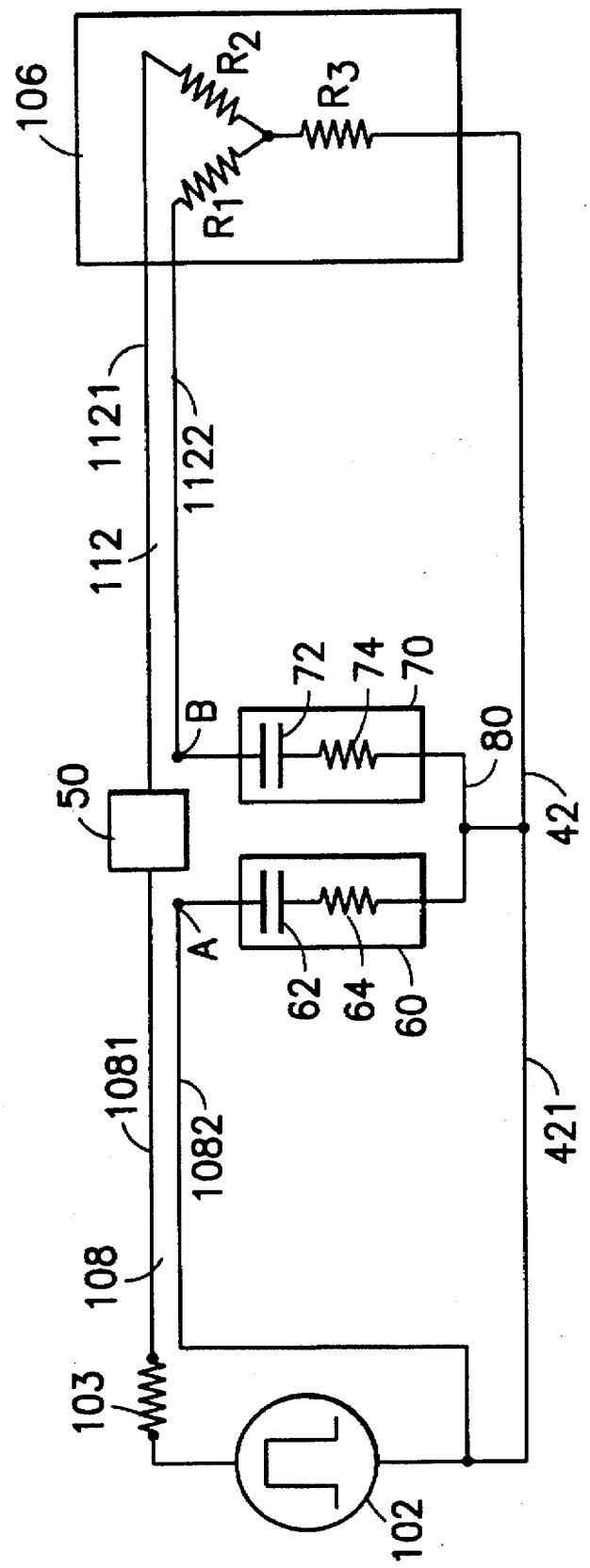
FIG. 4A is an equivalent circuit diagram embodying invention.

FIG. 4A explains the theory behind the invention. It differs from FIG. 3 in that grounding element 60 (which comprises resistor 64 and capacitor 62, connected in series), and grounding element 70 (which comprises resistor 74 and capacitor 72, connected in series), are respectively connected between ends A and B, via common plate 80, to common conductor 42.

Grounding elements 60 and 70 can be set up in accordance with the necessary pulse quality, and it is not necessary to connect a grounding element to a second conductor of a connected line for all probes. When the probes are not separate, grounding elements are generally used for all of the probes. Moreover, in terms of production, it is preferred that the values of resistors 64 and 74 and capacitors 62 and 72 be selected so that they are, respectively, the same values.

Value C of capacitors 62 and 72 must be smaller than the capacity-to-ground allowed by the guard line of the SMUG. The operation of the SMUG will be unstable if this is not the case. By means of this example, the allowable capacity-to-ground is 5,000 pF per port of the SMUG, and since probes that are connected in parallel to the same port of the SMUG are up to 4 probes, C=1,000 pF. The higher value of C is preferable.

Several methods can be used for selecting resistance R of resistors 64 and 74. First, the resistance is selected so that high-frequency transmission signals of the pulse input, etc., are minimized and attenuated in the loop comprising the second conductor of the line, the grounding element, common plate 80, and partial conductor 421 from common plate 80 of common conductor 42 to the aforementioned second conductor.

The characteristic impedance of the loop Zo is the positive square root of the value of L/C. Here loop resistance is Rt (including R), inductance is L, and capacity is C.

By employing one method, 2L/Rt is set at a specific time T (for instance, 1/10 of the pulse width). Inductance L and resistance Rt compose the loop that is made from the SWM to the line and grounding element 60 at point A and from the ground element through the common conductor to the second conductor of the line, so that Rt=2L/T. R is calculated from above Rt: specific resistance by subtracting parasitic resistance other than R.

By means of another method, Rt is made 2Zo or less in order to reduce or eliminate, the amplitude of the ringing of the aforementioned loop, and R is determined from Rt. Rt=Zo in the example of this invention.

By means of yet another example, determinations are performed experimentally by actually applying a pulse. In FIG. 4A, determinations are performed with DUT 50 connected between first conductors 1081 and 1121 and load 106. An oscilloscope pattern based on a value of R1=R3=0, and R is adjusted so that a specific wave shape can be monitored. Actually, the wave shape at both ends is monitored with R2 as the characteristic impedance of the line.

Figure 1:
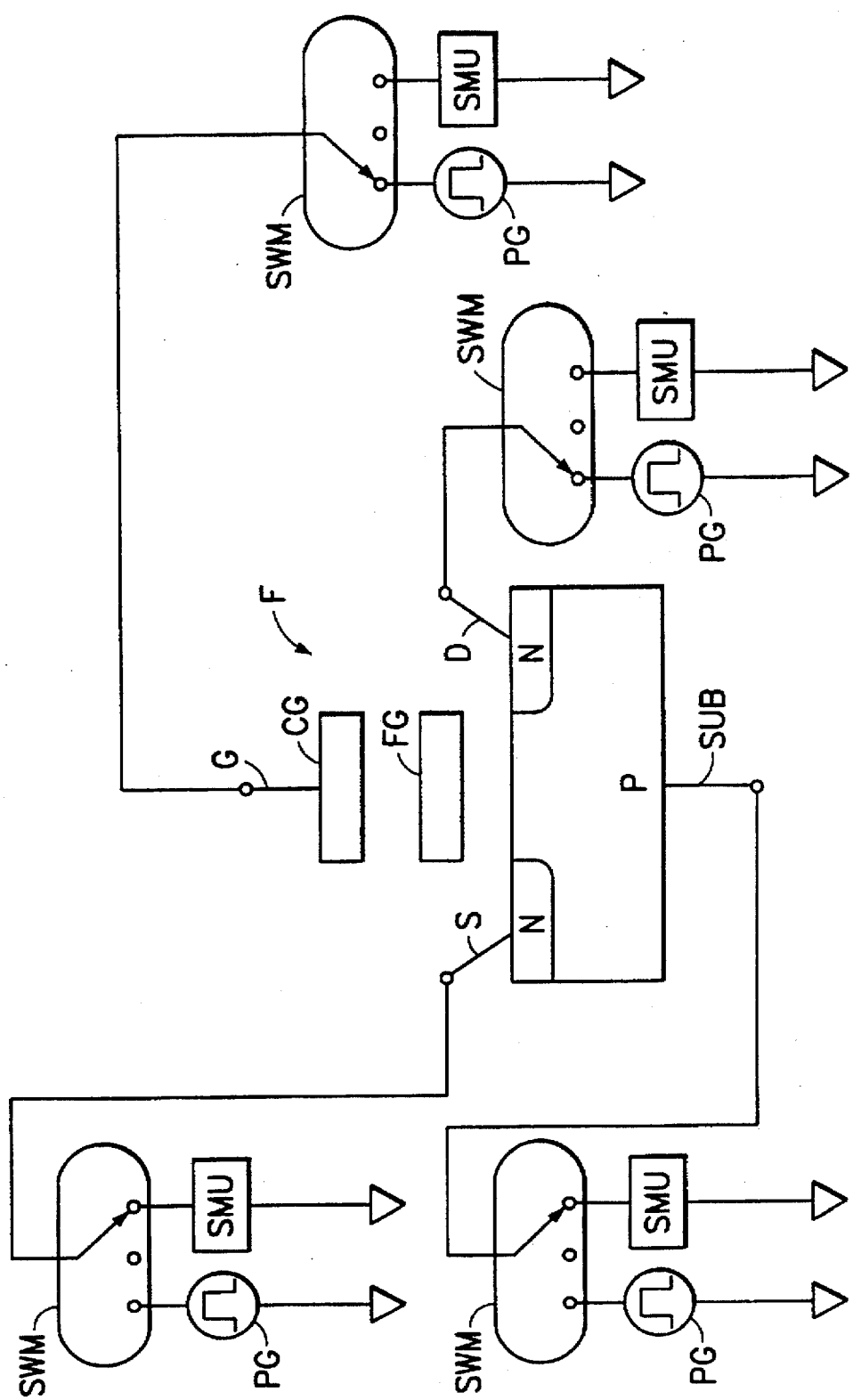
FIG. 1 is a block diagram of a prior art measurement system for a flash memory cell.
Figure 2:
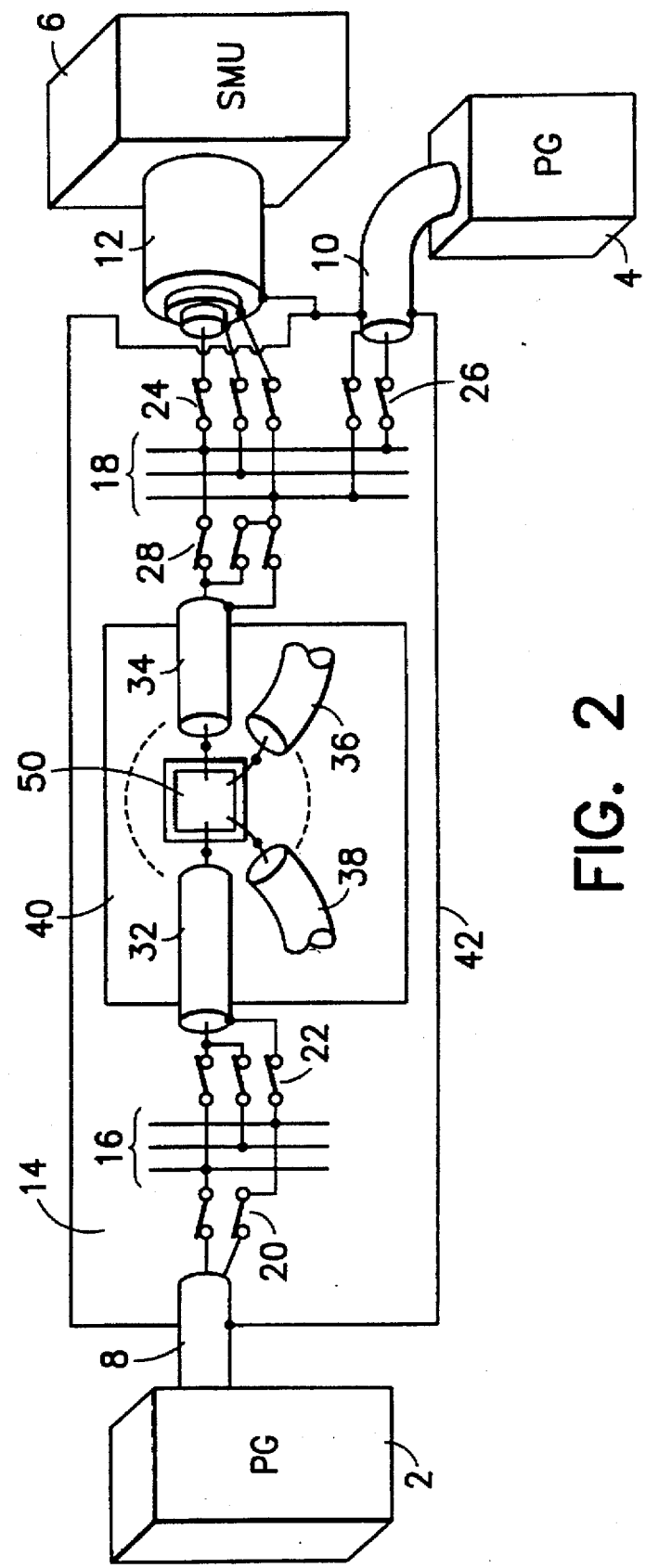
FIG. 2 is a partial block diagram of the measurement system for the circuit-components in FIG. 1.
Figure 4B:
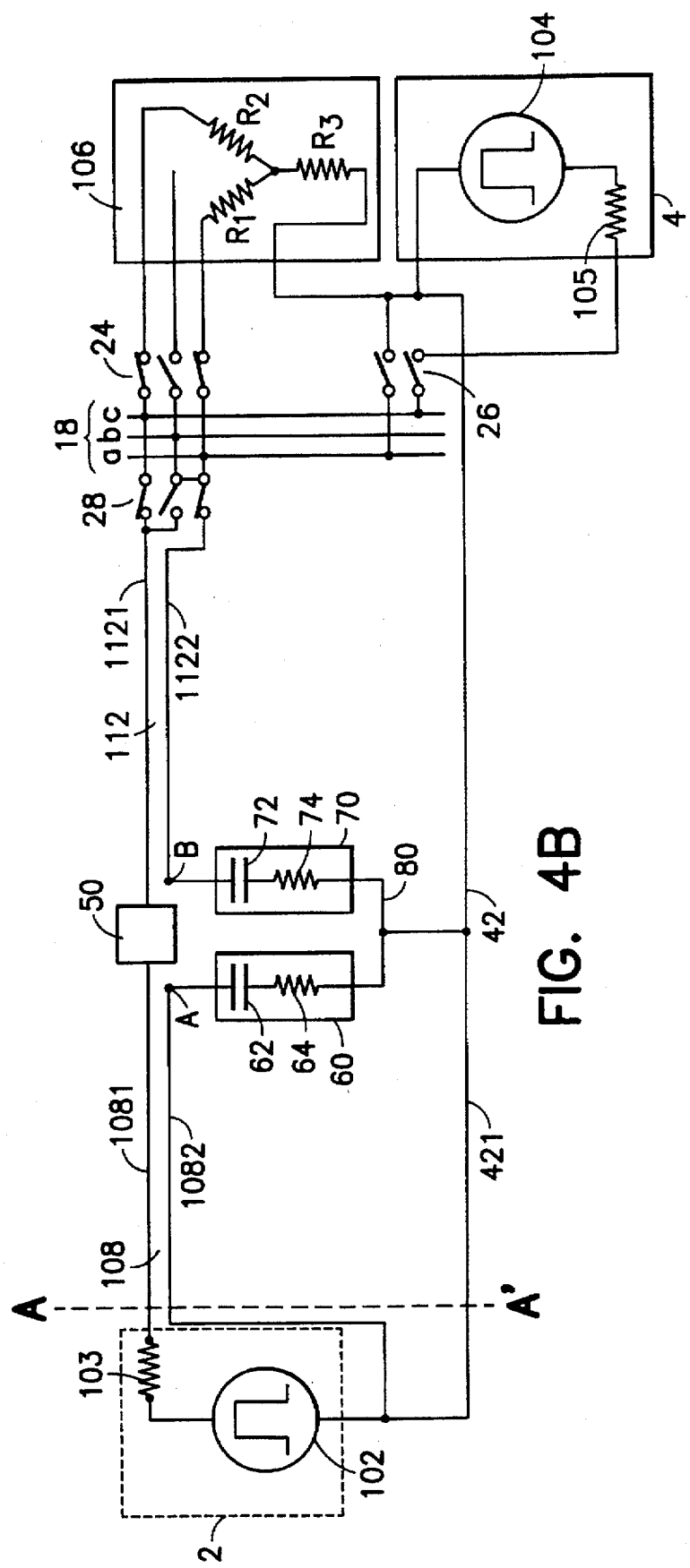
FIG. 4B is the equivalent circuit in FIG. 4A, modified to show interconnections made in accordance with the invention.

FIG. 4B is a modified version in FIG. 4A. In FIG. 4B, line 112 has been broken and bus 18 and switches 24, 26 and 28 from FIG. 2 have been inserted. An equivalent circuit of PG 4, including pulse source 104 and resistor 105, is connected to bus 18 via switch 26. Switches 24, 26 and 28 are positioned to correspond to the equivalent circuit of FIG. 4A. More specifically, all contacts of switch 26 are open, disconnecting PG 4 from bus 18. This results in the following connections:

line a of bus 18 is connected to conductor 1122 and resistor R1, line b of bus 18 is disconnected from both line 112 and load 105, and line c of bus 18 is connected to conductor 1121 and resistor R2.

When PG 4 is to be operatively connected to line 112, switches 24 and 28 are opened and all contacts of switch 26 are closed. A similar connection configuration (with respect to PG2) is configured by the insertion at line A—A' of bus 16 and switches 20, 22 (not shown).

Figure 5:
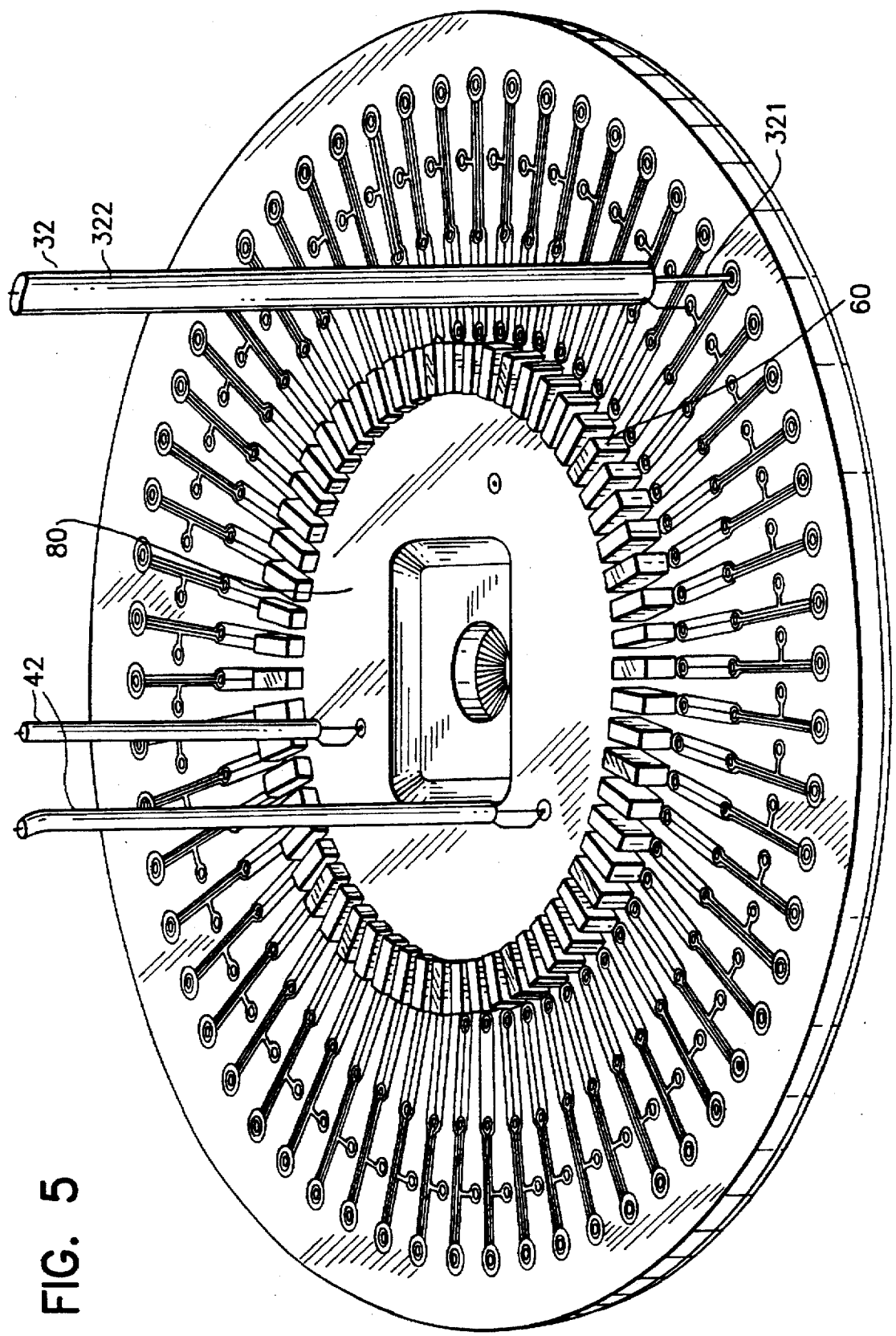
FIG. 5 is a partial oblique view of the packaged state of the invention.
Figure 6:
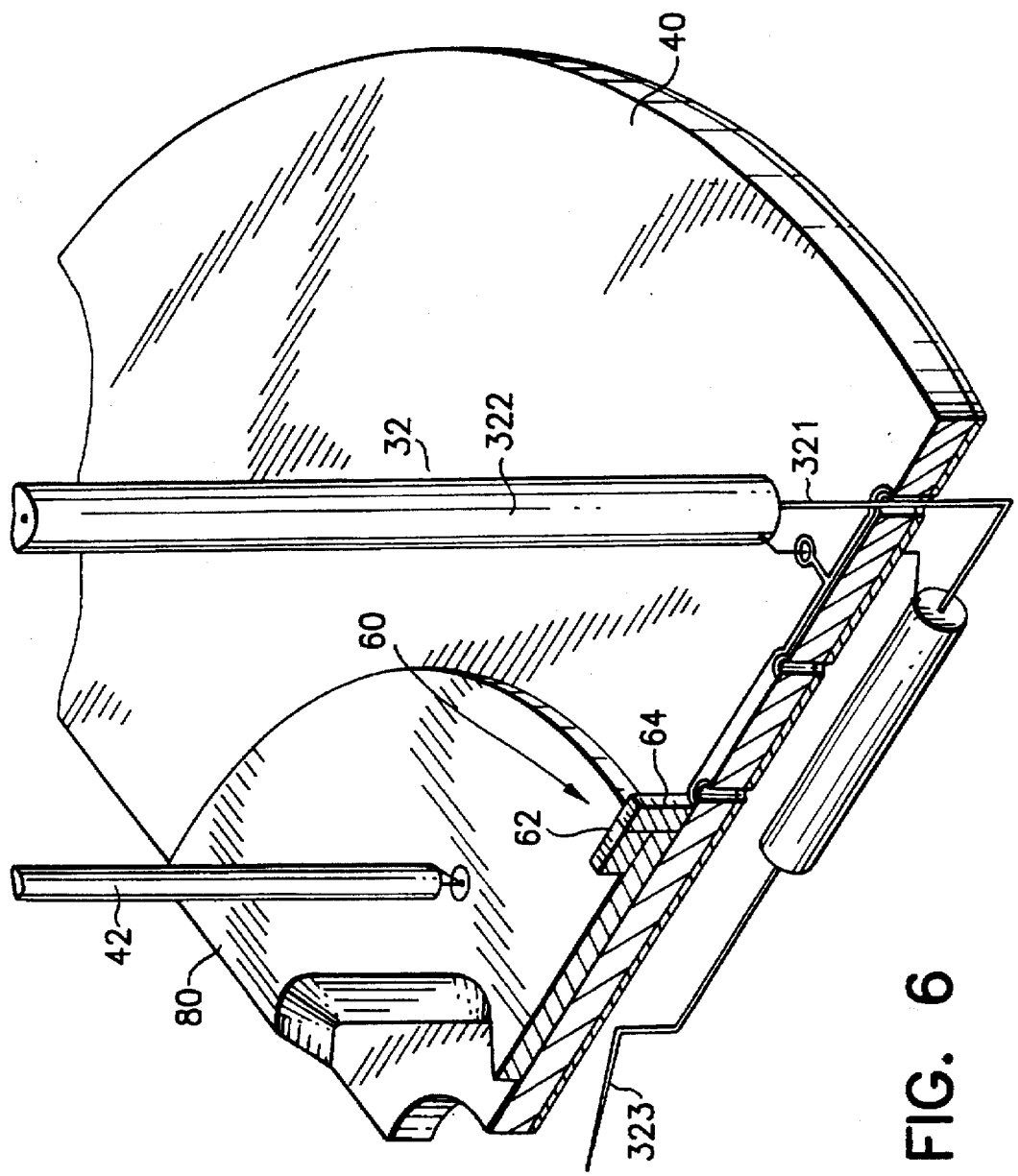
FIG. 6 is a partial cross section of the circuit in FIG. 5.

The structure of a probe apparatus that actually uses this invention will now be explained. FIG. 5 is an oblique view from the top of a probe card in which grounding components 60 and 70 are packaged. It also contains probes as shown in FIG. 6. FIG. 6 shows the cross section of said card device, cut perpendicularly along a straight line that connects first conductor 321 of line 32 (corresponds to line 1081 of FIG. 4A) to the terminals of grounding element 60 in the probe card of FIG. 5. Second conductor 322 of line 32 is extended and connected to resistor 64 by a strip wire. One terminal of capacitor 62 is connected directly to resistor 64, while the other terminal is connected to plate 80.

The probe apparatus in accordance with this invention comprises the probe card and a circuit interconnecting the probe card and SWM also.

As previously explained, by means of this invention, a probe apparatus is obtained that can be used for both low-frequency and high-frequency measurements, and is very useful for measurements of circuit components that require both types of measurements.

What is claimed is:

1. A probe apparatus for use in both high frequency signal measurements and low frequency signal measurements, said apparatus comprising:

a line comprising a first conductor and a second conductor, said line having a first end and a second end;

a common conductor connected to ground;

a series connected resistor-capacitor circuit connected between said common conductor and said second conductor at said second end of said line; and switch means connected to said first conductor and second conductor at said first end of said line and configured in a first state when said probe apparatus is employed for high frequency signal measurements, said first state connecting said first conductor of said line to a signal-carrying conductor of a high frequency line and connecting said second conductor to a ground connection, said switch means configured in a second state when said probe apparatus is employed for low frequency measurements, said second state connecting said first conductor to a signal-carrying conductor of a low frequency line and connecting said second conductor to a guard conductor forming a portion of said low frequency line.

2. The probe apparatus as recited in claim 1 further comprising:
   high frequency measurement means connected to said high frequency line and low frequency measurement means connected to said low frequency line.

3. The probe apparatus as recited in claim 2 wherein said capacitor exhibits a capacity which corresponds to a capacitance-to-ground from said guard line which forms a portion of said low frequency measurement means.

4. The probe apparatus as recited in claim 3 wherein said resistor has a value with which approximates a value of a specific resistance of a loop comprising said second conductor, said resistor and capacitor connected in series, and said common conductor.

* * * * *